(12) United States Patent
Kerkar et al.

(10) Patent No.: US 10,295,712 B2
(45) Date of Patent: May 21, 2019

(54) BACKSHEETS FOR PHOTOVOLTAIC MODULES USING INFRARED REFLECTIVE PIGMENTS

(71) Applicant: Honeywell International Inc., Morristown, NJ (US)

(72) Inventors: Awdhoot V. Kerkar, Rockaway, NJ (US); Neo Huang, Shanghai (CN); Jeffrey D. Pratt, Budd Lake, NJ (US)

(73) Assignee: HONEYWELL INTERNATIONAL INC., Morris Plains, NJ (US)

(*) Notice: Subject to any disclaimer, the term of this patent is extended or adjusted under 35 U.S.C. 154(b) by 1195 days.

(21) Appl. No.: 13/782,928

(22) Filed: Mar. 1, 2013

(65) Prior Publication Data

US 2013/0276876 A1    Oct. 24, 2013

Related U.S. Application Data

(60) Provisional application No. 61/635,615, filed on Apr. 19, 2012.

(51) Int. Cl.
*G02B 5/08* (2006.01)
*H01L 31/049* (2014.01)
*H01L 31/056* (2014.01)

(52) U.S. Cl.
CPC .......... *G02B 5/0816* (2013.01); *H01L 31/049* (2014.12); *H01L 31/056* (2014.12); *Y02E 10/52* (2013.01)

(58) Field of Classification Search
CPC ....... Y02E 10/50; Y02E 10/52; H01L 31/048; H01L 31/049; H01L 31/0481;
(Continued)

(56) References Cited

U.S. PATENT DOCUMENTS 7,521,118 B2   4/2009   Hugo
7,829,783 B2   11/2010  Krajewski et al.
(Continued)

FOREIGN PATENT DOCUMENTS

CN   102066107 A   5/2011
CN   102361755 A   2/2012
(Continued)

OTHER PUBLICATIONS

Augustin McEvoy et al., Practical Handbook of Photovoltaics—Fundamentals and Applications, Academic Press,1st Edition, 2011.
(Continued)

*Primary Examiner* — Mayla Gonzalez Ramos
(74) *Attorney, Agent, or Firm* — Lorenz & Kopf, LLP

(57) ABSTRACT

A multi-layer backsheet for a photovoltaic module comprising a first layer having a reflectance of more than 25% of a light with a wavelength anywhere from about 1000 nm to about 2100 nm, and a reflectance of less than 35% of all light with a wavelength from about 380 nm to about 750 nm; and a second layer having a reflectance of more than 50% of all light with a wavelength from about 380 nm to about 2000 nm. A photovoltaic module comprising the multi-layer backsheet, a method of making the photovoltaic module, and a method of converting sunlight into electricity by exposing the photovoltaic module to sun light.

19 Claims, 4 Drawing Sheets

(58) Field of Classification Search
CPC ......... H01L 31/02167; H01L 31/02327; H01L 31/054; H01L 31/0487; H01L 31/0527; H01L 31/056; H02B 5/0816
See application file for complete search history.

(56) References Cited

U.S. PATENT DOCUMENTS

| | | | |
|---|---|---|---|
| 7,985,919 | B1 | 7/2011 | Roscheisen et al. |
| 8,062,744 | B2 | 11/2011 | DeBergalis et al. |
| 2009/0029176 | A1 | 1/2009 | Nishida et al. |
| 2009/0133738 | A1 | 5/2009 | Shiao et al. |
| 2009/0133739 | A1* | 5/2009 | Shiao .................... H01L 31/048 136/251 |
| 2010/0043871 | A1 | 2/2010 | Xia et al. |
| 2010/0092759 | A1 | 4/2010 | Fan et al. |
| 2011/0043901 | A1 | 2/2011 | Watanabe et al. |
| 2011/0146762 | A1 | 6/2011 | Temchenko et al. |
| 2011/0203643 | A1* | 8/2011 | Watanabe ............. H01L 31/048 136/251 |
| 2011/0284071 | A1* | 11/2011 | Hashimoto ............. B32B 27/08 136/256 |

FOREIGN PATENT DOCUMENTS

| | | | | |
|---|---|---|---|---|
| JP | 2006-273985 A | 10/2006 | | |
| JP | 2006270025 A | 10/2006 | | |
| JP | 2007-103813 A | 4/2007 | | |
| JP | 2007128943 | 5/2007 | | |
| JP | 2007177136 A | 7/2007 | | |
| JP | 2008-205080 A | 9/2008 | | |
| JP | 2009-119864 | 6/2009 | | |
| JP | 2010109349 A | 5/2010 | | |
| JP | WO 2010071032 A1 * | 6/2010 | ........... H01L 31/048 |
| JP | 2010153806 A | 7/2010 | | |
| JP | 2010-177386 A | 8/2010 | | |
| JP | 2010177386 A | 8/2010 | | |
| JP | 2010199551 A | 9/2010 | | |
| JP | 2010199552 A | 9/2010 | | |
| JP | 2010208158 | 9/2010 | | |
| JP | 2010208158 A | 9/2010 | | |
| JP | 2011-151094 | 8/2011 | | |
| JP | 201219138 A | 1/2012 | | |
| JP | 2012006387 A | 1/2012 | | |
| WO | 2010/062337 A1 | 6/2010 | | |
| WO | 2011/101657 | 8/2011 | | |
| WO | 2012009113 A2 | 1/2012 | | |

OTHER PUBLICATIONS

G.N. Tiwari and Swapnil Dubey, Fundamentals of Photovoltaic Modules and their Applications, RSC Publishing, 2010.
Japanese Office Action for Application No. 2015-507023 dated Jan. 30, 2017.
Japanese Final Office Action for Application No. 2015-507023 dated Oct. 2, 2017.
Japanese Office Action for Application No. 2015-507023 dated Jun. 13, 2017.
Chinese First Office Action for Application No. 201380031719.5 dated Feb. 2, 2016.
Chinese Second Office Action for Application No. 201380031719.5 dated Oct. 28, 2016.
Chinese Third Office Action for Application No. 201380031719.5 dated May 5, 2017.
Extended EP Search Report for Application No. 13777773.6 dated Nov. 25, 2015.
International Searching Authority, Written Opinion of the International Searching Authority for International Patent Application No. PCT/US2013/034287 dated Jul. 24, 2013.
International Searching Authority, International Search Report for International Patent Application No. PCT/US2013/034287 dated Jul. 24, 2013.
International Searching Authority, International Preliminary Report on Patentability for International Patent Application No. PCT/US2013/034287 dated Oct. 24, 2013.
Indian Office Action for Indian Application No. 8106/DELNP/2014 dated Jan. 17, 2019.

* cited by examiner

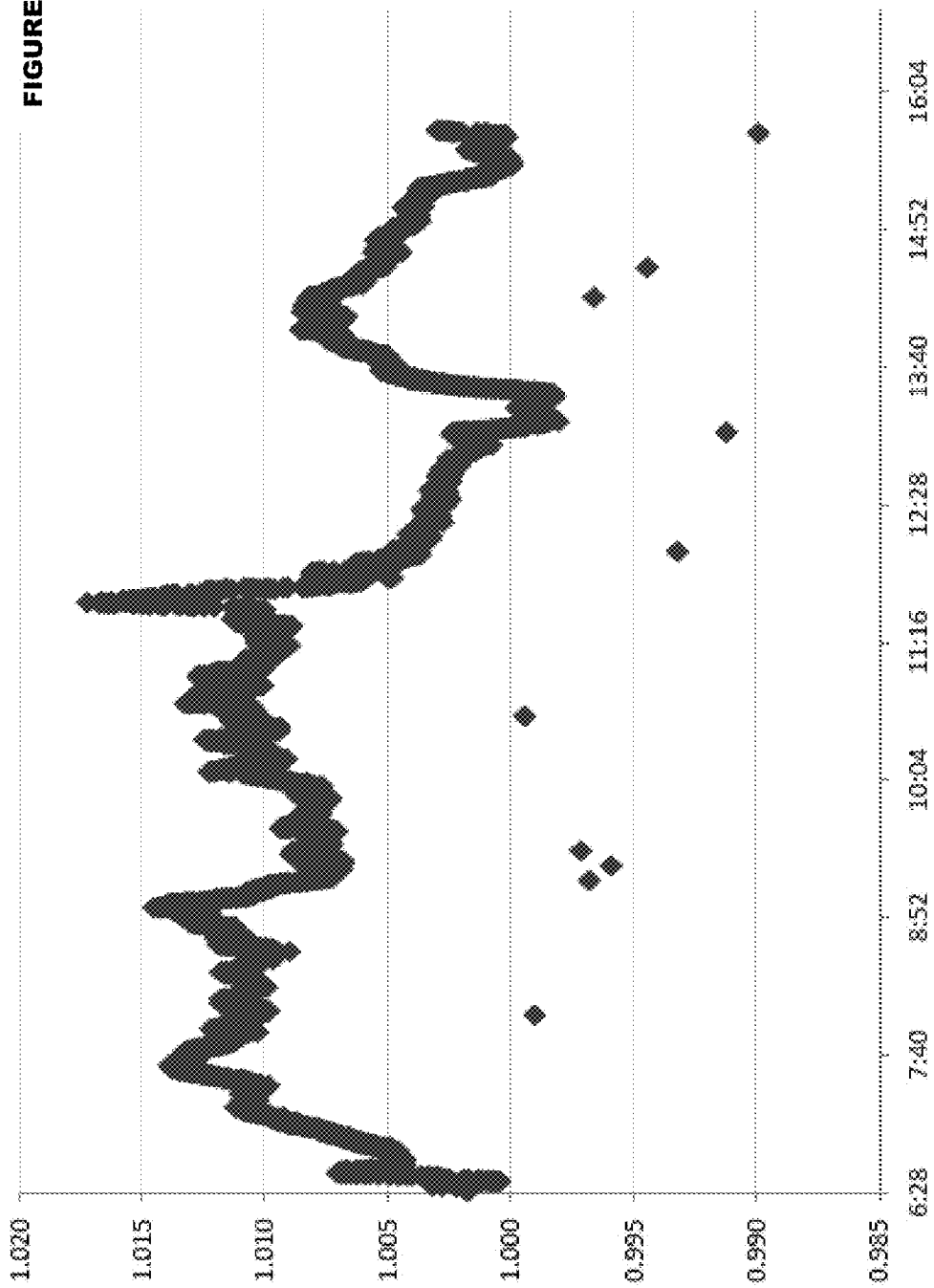

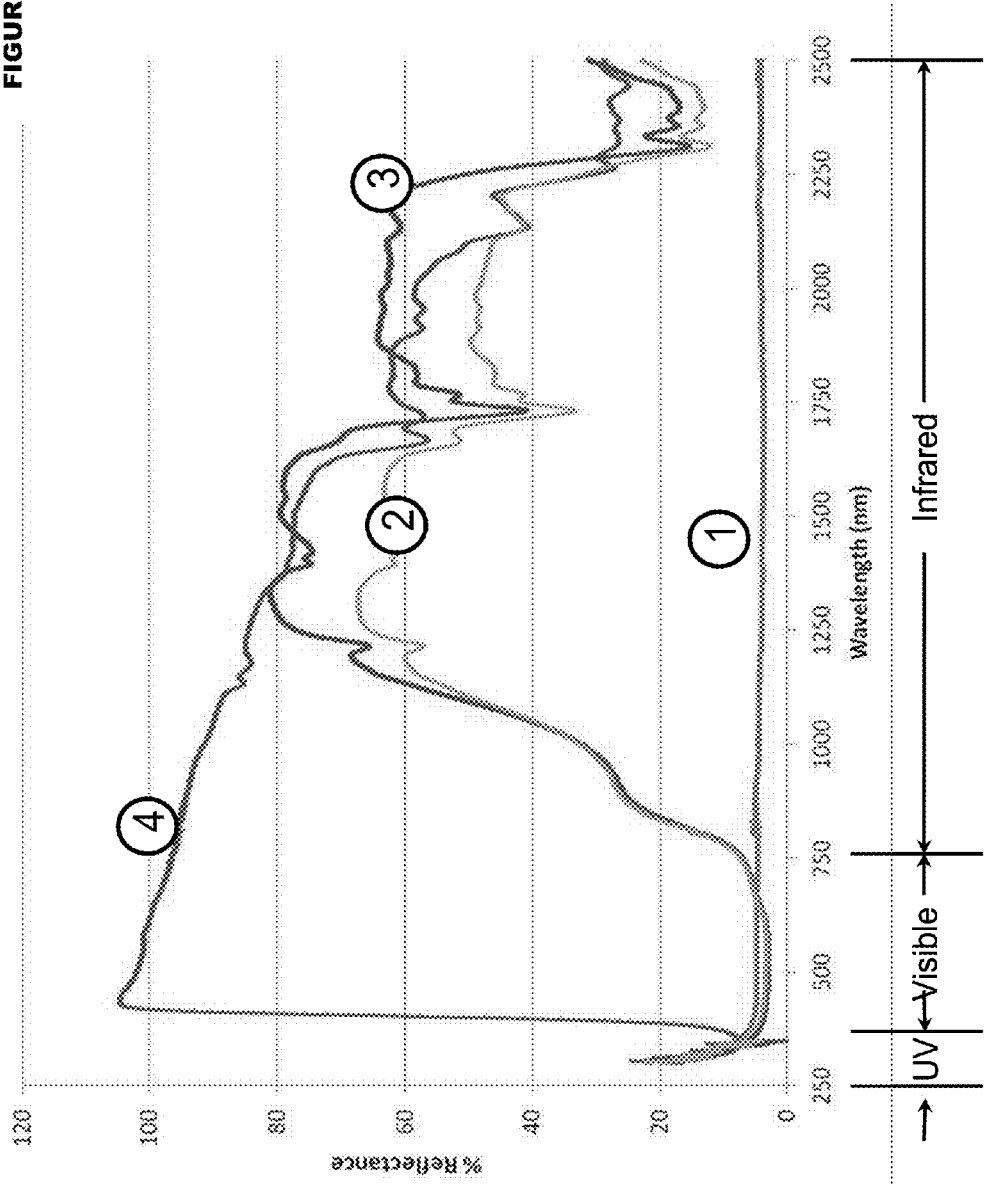

BACKSHEETS FOR PHOTOVOLTAIC MODULES USING INFRARED REFLECTIVE PIGMENTS

CROSS REFERENCE TO RELATED APPLICATION

The present application claims priority under 35 U.S.C. § 119(e) to U.S. Provisional Patent Application No. 61/635,615, filed on Apr. 19, 2012, the disclosure of which is incorporated herein by reference in its entirety.

FIELD OF THE INVENTION

The present invention relates to photovoltaic modules and, more specifically, to protective backsheets.

BACKGROUND OF THE INVENTION

Photovoltaic cells are widely used to convert sunlight into electricity and are often interconnected with other photovoltaic cells in photovoltaic modules. Individual photovoltaic modules are usually encapsulated to protect the module components including the photovoltaic cells from the environment. Photovoltaic modules are traditionally mounted outdoors on rooftops or in wide-open spaces where their exposure to sunlight is maximized. When the intensity of sunlight increases, electrical output from photovoltaic modules also increases. However, the efficiency with which a photovoltaic module converts sunlight into electricity is usually only about 20%. The remaining about 80% of the sunlight is reflected back or absorbed by the module. Energy that is absorbed results in an increase of the operating temperature of the module. Excessive heat decreases the efficiency with which a photovoltaic module converts sunlight into electricity. The optimal operating temperature for most photovoltaic modules is around 47° C. Many photovoltaic modules lose about 0.5% efficiency for every degree Celsius that their operating temperature increases. A variety of factors may contribute to an increased operating temperature, such as greater ambient air temperature during the day, radiant heat from ground surfaces and other nearby surfaces which may emit heat generated from sun exposure, and increased temperature of the solar module itself from extended sun exposure.

This problem is often exacerbated in situations where photovoltaic modules are integrated in building structures which often have dark, for example black, backsheets for esthetic reasons. Usually, photovoltaic modules have backsheets that provide electrical insulation of the photovoltaic cells within the modules and protect the photovoltaic cells from the ingress of moisture and other environmental factors. While the typically rectangular photovoltaic cells in a photovoltaic module are located in close proximity, there are usually small gaps between them that expose the underlying backsheet to sunlight. In 10-15% of the total area covered by a typical mono crystal silicon photovoltaic module comprising 72 cells, the backsheet is exposed to direct sunlight. Where photovoltaic modules are integrated in a building structure, their backsheets are usually dark, for example black, to make the photovoltaic modules blend in with the existing architectural colors. The dark, or even black, appearance of the backsheet is usually generated by coating the backsheet with the pigment carbon black or iron oxide, or by mixing these pigments with the material the backsheet is made of during the process of manufacturing the backsheet. Carbon black absorbs basically all light visible to humans. In addition, carbon black also adsorbs infrared light, which is electromagnetic radiation with wavelengths longer than that of light generally visible to humans, i.e., with wavelengths ranging from the edge of visible red light at about 750 nm to about 300 μm. This absorption of infrared light increases the temperature of the backsheet and, ultimately, the operating temperature of the entire photovoltaic module. By contrast to black pigments like carbon black, pigments appearing completely white, for example, reflect most, and thus do no absorb any, light visible to humans, and they also reflect most of the infrared light. Thus, while dark, or even black, backsheets in photovoltaic modules are desirable for esthetic reasons, such backsheets tend to increase the photovoltaic modules' operating temperature. This reduces the photovoltaic modules' efficiency in converting sun light into electricity.

There remains a need for improved methods of optimizing the operating temperature of building-integrated photovoltaic modules. The present invention addresses this need.

SUMMARY OF THE INVENTION

The invention provides a multi-layer backsheet for a photovoltaic module comprising a first layer having a reflectance of more than 25% of a light with a wavelength anywhere from about 1000 nm to about 2100 nm, and a reflectance of less than 35% of all light with a wavelength from about 380 nm to about 750 nm; and a second layer having a reflectance of more than 50% of all light with a wavelength from about 380 nm to about 2000 nm; wherein said first layer and said second layer are adjacent to each other.

In some embodiments of the present invention, the first layer comprises infrared-reflective pigments. In some preferred embodiments of the present invention, the infrared-reflective pigments are inorganic pigments. In even more preferred embodiments of the present invention, the inorganic pigments are mixed metal oxides. In some embodiments of the present invention, the infrared-reflective pigments are present at a concentration of from about 1 weight % to about 20 weight % of the total weight of the first layer. In some preferred embodiments of the present invention, the infrared-reflective pigments are present at a concentration of from about 1 weight % to about 14 weight % of the total weight of the first layer.

In some embodiments of the present invention, the first layer and the second layer each comprise a polymer. In some preferred embodiments of the present invention, the first layer and the second layer each comprise ethylene vinyl acetate.

In some embodiments of the present invention, the first layer has a reflectance of less than 20% of all light with a wavelength from about 380 nm to about 750 nm. In some preferred embodiments of the present invention, the first layer has a reflectance of less than 10% of all light with a wavelength from about 380 nm to about 750 nm. In some embodiments of the present invention, the first layer has a reflectance of more than 50% of a light with a wavelength anywhere from about 1250 nm to about 1550 nm. In some preferred embodiments of the present invention, the first layer has a reflectance of more than 60% of all light with a wavelength from about 1250 nm to about 1550 nm.

In some embodiments of the present invention, the second layer has a reflectance of more than 80% of all light with a wavelength from about 380 nm to about 750 nm. In some preferred embodiments of the present invention, the second layer has a reflectance of more than 90% of all light with a wavelength from about 380 nm to about 750 nm.

In some embodiments of the present invention, the side of the multi-layer backsheet formed by the first layer has a reflectance of more than 70% of all light with a wavelength from about 1250 nm to about 1550 nm.

In some embodiments of the present invention, the first layer has a thickness of from about 20 µm to about 125 µm, and the second layer has a thickness of from about 50 µm to about 150 µm.

The invention further provides a photovoltaic module comprising the multi-layer backsheet as defined above. In some embodiments of the present invention, the photovoltaic module further comprises a transparent top layer. In some preferred embodiments of the present invention, the photovoltaic module further comprises an encapsulant-embedded photovoltaic cell disposed between the transparent top layer and the multi-layer backsheet. In some more preferred embodiments of the present invention, the encapsulant comprises ethylene vinyl acetate.

The invention further provides a method of making a photovoltaic module, comprising steps of contacting a layer comprising infrared-reflective pigments with a layer comprising white pigments so that a laminate results, and using said laminate in the assembly of a photovoltaic module as defined above.

The invention further provides a method of converting sunlight into electricity, comprising a step of exposing a photovoltaic module as defined above to sun light.

BRIEF DESCRIPTION OF THE DRAWINGS

FIG. 3 shows the ratio of the voltage generated by a photovoltaic module with a backsheet containing infrared-reflective (IR) pigments versus the voltage generated by a photovoltaic module with a backsheet containing no infrared-reflective (IR) pigments. The ratio is plotted over the time of the day the voltage measurements were taken.

FIG. 4 shows the reflectance of light in the range between 250 nm and 2500 nm of (1) traditional black backsheets containing no IR pigments (negative control), (2) of black backsheets containing IR pigments, (3) of black backsheets containing IR pigments and a white backing layer, and (4) of white backsheets (positive control). The reflectance (in percent of incoming light) is plotted over the wavelength of the incoming light.

DETAILED DESCRIPTION OF THE INVENTION

Figure 1:
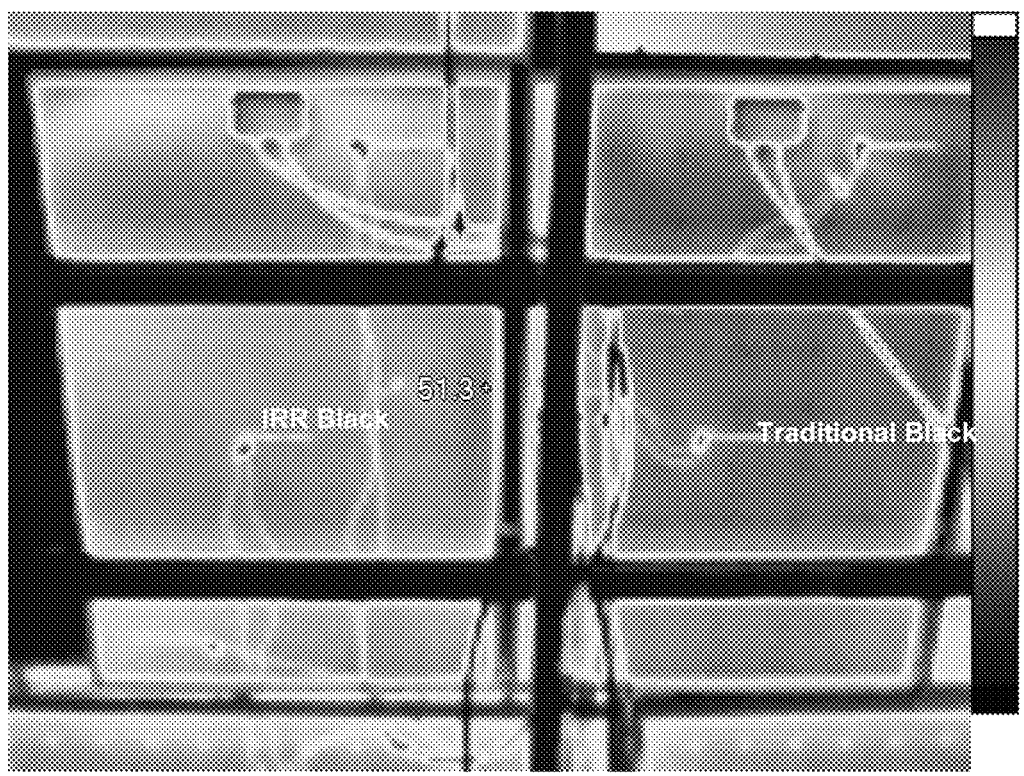
FIG. 1 shows the temperature profile of a photovoltaic module with a backsheet containing infrared-reflective (IR) pigments (left panel) and the temperature profile of a photovoltaic module with a backsheet containing carbon black instead of infrared-reflective (IR) pigments (right panel). The darker color of the module on the right side indicates that it has a higher temperature.

The use of dark, or even black, backsheets that reflect infrared light results in a reduced operating temperature of the photovoltaic modules in which these backsheets are used. It has now been surprisingly found that the reflection of infrared light by these backsheets can be enhanced by the additional use of a backing layer that reflects visible and infrared light and that is attached to the backsheet, as further explained below.

The present invention provides a multi-layer backsheet for a photovoltaic module comprising a first layer and a second layer; wherein said first layer and said second layer are adjacent to each other. The present invention further provides a photovoltaic module comprising the above described multi-layer backsheet. The present invention also provides a photovoltaic module having a transparent top layer, said multi-layer backsheet, and at least one encapsulant-embedded photovoltaic cell disposed between the transparent top layer and the multi-layer backsheet, wherein said first layer is disposed between the at least one photovoltaic cell and said second layer. The manufacture of such multi-layer backsheets and photovoltaic modules is well known to those skilled in the art. Non-limiting examples of the manufacture and commercial availability of these items is provided further below, particularly in the Examples. Additional background information about photovoltaic cells, photovoltaic modules and backsheets, including their manufacture, can be found in, for example, Augustin McEvoy et al., Practical Handbook of Photovoltaics—Fundamentals and Applications, Academic Press, 1$^{st}$ Edition, 2011; and in G.N. Tiwari and Swapnil Dubey, Fundamentals of Photovoltaic Modules and their Applications, RSC Publishing, 2010.

A photovoltaic module (also called photovoltaic panel or solar panel) is an assembly of usually more than one photovoltaic cell. Photovoltaic cells (also called solar cells) use light energy (photons) from the sun to generate electricity based on the photovoltaic effect. The photovoltaic cells are usually connected electrically to one another and to the rest of the system. Photovoltaic cells are usually encapsulated to protect them from mechanical damage and moisture. Most photovoltaic modules are rigid, but semi-flexible ones are available, based on thin-film photovoltaic cells. Often, photovoltaic modules contain a transparent top layer, a backsheet, and at least one encapsulant-embedded photovoltaic cell disposed between the transparent top layer and the backsheet. The load carrying part of a photovoltaic module can either be the top layer or the backsheet. The majority of photovoltaic modules use wafer-based crystalline silicon photovoltaic cells or thin-film photovoltaic cells based on cadmium telluride or silicon. Photovoltaic cells are commercially available form many sources. Non-limiting examples of companies that sell photovoltaic cells are Suntech, First Solar, Sharp Solar, Yingli, Trina Solar, Canadian Solar, Hanwha Solarone, Sunpower, Renewable Energy Corporation and Solarworld.

As further explained below, the layers of the backsheet may include pigments which reflect light of a certain wavelength. Light visible to the human eye (also called visible light herein) is electromagnetic radiation with a wavelength in the range from about 380 nanometres (nm) to about 750 nm. Generally, electromagnetic radiation is classified according to its wavelength into radio waves, microwaves, infrared light, visible light, ultraviolet light, X-rays and gamma rays. Infrared (IR) light is electromagnetic radiation with a wavelength longer than that of visible light. Conventionally, infrared light is considered to have a wavelength in the range from about 750 nm to about 300 micrometers (also called µm or microns).

When visible light or infrared light strikes an object, the light can be reflected by the object, go through the object (i.e., be transmitted by the object) or be absorbed by the object. In part, the color a human eye perceives an object to be is determined by the wavelength of the light that strikes the object and by the wavelength of the light that is reflected by the object into the human eye. When the object is illuminated by sun light for example (which includes visible light and also infrared light) and, with respect to said visible light, only reflects the light in the range from about 700 nm to about 635 nm, the object appears red. When the object is illuminated by sun light and, with respect to said visible light, reflects only the light in the range from about 635 nm to about 590 nm, the object appears orange. When the object is illuminated by sun light and, with respect to said visible light, reflects only the light in the range from about 590 nm to about 560 nm, the object appears yellow. When the object is illuminated by sun light and, with respect to said visible light, reflects only the light in the range from about 560 nm to about 490 nm, the object appears green. When the object is illuminated by sun light and, with respect to said visible light, reflects only the light in the range from about 490 nm to about 450 nm, the object appears blue. When the object is illuminated by sun light and, with respect to said visible light, reflects only the light in the range from about 450 nm to about 400 nm, the object appears violet. When the object is illuminated by sun light and reflects at least all visible light, the object appears completely white. When the object is illuminated by sun light and reflects none of the visible light, because all of it is absorbed or transmitted by the object, the object appears completely black.

The present invention provides a multi-layer backsheet for a photovoltaic module comprising a first layer having a reflectance of more than 25% of a light with a wavelength anywhere from about 1000 nm to about 2100 nm, and a reflectance of less than 35% of all light with a wavelength from about 380 nm to about 750 nm; and a second layer having a reflectance of more than 50% of all light with a wavelength from about 380 nm to about 2000 nm.

A layer having a reflectance of more than 25%, for example, of a light with a wavelength anywhere from about, for example, 1000 nm to about 2100 nm, as used herein, does not mean that all light with a given wavelength in said range is reflected by more than 25%. Rather, it means that at least one light with a wavelength somewhere in the range from about 1000 nm to about 2100 nm is reflected by more than 25%. Thus, the above phrase covers a situation where, for example, light with a wavelength of about 1200 nm is reflected by more than 25%, while light with a wavelength of about 1500 nm is not reflected by more than 25%. Statements herein that use the same language except for a different degree of reflectance and different wavelengths have the same meaning in so far that not all light within a recited range of wavelengths is necessarily reflected to the specified degree. By contrast, a layer having a reflectance of more than 50%, for example, of all light with a wavelength from about, for example, 380 nm to about 2000 nm means that light of every single wavelength within the recited range is reflected by more than 50%. Statements herein that use the same language except for a different degree of reflectance and different wavelengths have the same meaning in so far that all light within a recited range of wavelengths is necessarily reflected to the specified degree. Objects, e.g., backsheets and layers within backsheets, reflecting light of a particular wavelength can be made by coating the object with a specific pigment that reflects light of the particular wavelength. Alternatively, such pigments can be mixed with the material the object is made of during the process of manufacturing the object. Such coating and mixing is well known in the art and therefore not further described herein.

The present invention provides that the first layer has a reflectance of less than 35% of all light with a wavelength from about 380 nm to about 750 nm. In some embodiments of the present invention, the first layer has a reflectance of less than 50% of all light with a wavelength from about 380 nm to about 750 nm. In other embodiments of the present invention, the first layer has a reflectance of less than 40% of all light with a wavelength from about 380 nm to about 750 nm. In other embodiments of the present invention, the first layer has a reflectance of less than 30% of all light with a wavelength from about 380 nm to about 750 nm. In other embodiments of the present invention, the first layer has a reflectance of less than 20% of all light with a wavelength from about 380 nm to about 750 nm. In other embodiments of the present invention, the first layer has a reflectance of less than 10% of all light with a wavelength from about 380 nm to about 750 nm. In other embodiments of the present invention, the first layer has a reflectance of less than 5% of all light with a wavelength from about 380 nm to about 750 nm. In a preferred embodiment of the present invention, the first layer has a reflectance of less than 35% of all light with a wavelength from about 380 nm to about 750 nm. In a more preferred embodiment of the present invention, the first layer has a reflectance of less than 20% of all light with a wavelength from about 380 nm to about 750 nm. In an even more preferred embodiment of the present invention, the first layer has a reflectance of less than 10% of all light with a wavelength from about 380 nm to about 750 nm.

The present invention provides that the first layer has a reflectance of more than 25% of a light with a wavelength anywhere from about 1000 nm to about 2100 nm. In some embodiments of the present invention, the first layer has a reflectance of more than 30% of a light with a wavelength anywhere from about 1000 nm to about 2100 nm. In other embodiments of the present invention, the first layer has a reflectance of more than 40% of a light with a wavelength anywhere from about 1000 nm to about 2100 nm. In other embodiments of the present invention, the first layer has a reflectance of more than 50% of a light with a wavelength anywhere from about 1000 nm to about 2100 nm. In other embodiments of the present invention, the first layer has a reflectance of more than 60% of a light with a wavelength anywhere from about 1000 nm to about 2100 nm. In other embodiments of the present invention, the first layer has a reflectance of more than 70% of a light with a wavelength anywhere from about 1000 nm to about 2100 nm. In other embodiments of the present invention, the first layer has a reflectance of more than 80% of a light with a wavelength anywhere from about 1000 nm to about 2100 nm. In other embodiments of the present invention, the first layer has a reflectance of more than 90% of a light with a wavelength anywhere from about 1000 nm to about 2100 nm. In other embodiments of the present invention, the first layer has a reflectance of from about 25% to about 35% of a light with a wavelength anywhere from about 1000 nm to about 2100 nm. In other embodiments of the present invention, the first layer has a reflectance of from about 35% to about 45% of a light with a wavelength anywhere from about 1000 nm to about 2100 nm. In other embodiments of the present invention, the first layer has a reflectance of from about 45% to about 55% of a light with a wavelength anywhere from about 1000 nm to about 2100 nm. In other embodiments of the present invention, the first layer has a reflectance of from about 55% to about 65% of a light with a wavelength anywhere from about 1000 nm to about 2100 nm. In other embodiments of the present invention, the first layer has a reflectance of from about 65% to about 75% of a light with a wavelength anywhere from about 1000 nm to about 2100 nm. In a preferred embodiment of the present invention, the first layer has a reflectance of more than 25% of a light with a wavelength anywhere from about 1000 nm to about 2100 nm.

In some embodiments of the present invention, the first layer has a reflectance of more than 25% of a light with a wavelength anywhere from about 1250 nm to about 1550 nm. In other embodiments of the present invention, the first layer has a reflectance of more than 30% of a light with a wavelength anywhere from about 1250 nm to about 1550 nm. In other embodiments of the present invention, the first layer has a reflectance of more than 40% of a light with a wavelength anywhere from about 1250 nm to about 1550 nm. In other embodiments of the present invention, the first layer has a reflectance of more than 50% of a light with a wavelength anywhere from about 1250 nm to about 1550 nm. In other embodiments of the present invention, the first layer has a reflectance of more than 60% of a light with a wavelength anywhere from about 1250 nm to about 1550 nm. In other embodiments of the present invention, the first layer has a reflectance of more than 70% of a light with a wavelength anywhere from about 1250 nm to about 1550 nm. In other embodiments of the present invention, the first layer has a reflectance of more than 80% of a light with a wavelength anywhere from about 1250 nm to about 1550 nm. In other embodiments of the present invention, the first layer has a reflectance of more than 90% of a light with a wavelength anywhere from about 1250 nm to about 1550 nm. In other embodiments of the present invention, the first layer has a reflectance of from about 25% to about 35% of a light with a wavelength anywhere from about 1250 nm to about 1550 nm. In other embodiments of the present invention, the first layer has a reflectance of from about 35% to about 45% of a light with a wavelength anywhere from about 1250 nm to about 1550 nm. In other embodiments of the present invention, the first layer has a reflectance of from about 45% to about 55% of a light with a wavelength anywhere from about 1250 nm to about 1550 nm. In other embodiments of the present invention, the first layer has a reflectance of from about 55% to about 65% of a light with a wavelength anywhere from about 1250 nm to about 1550 nm. In other embodiments of the present invention, the first layer has a reflectance of from about 65% to about 75% of a light with a wavelength anywhere from about 1250 nm to about 1550 nm. In other embodiments of the present invention, the first layer has a reflectance of from about 75% to about 85% of a light with a wavelength anywhere from about 1250 nm to about 1550 nm. In a preferred embodiment of the present invention, the first layer has a reflectance of more than 50% of a light with a wavelength anywhere from about 1250 nm to about 1550 nm In some embodiments of the present invention, the first layer has a reflectance of more than 25% of all light with a wavelength from about 1250 nm to about 1550 nm. In other embodiments of the present invention, the first layer has a reflectance of more than 30% of all light with a wavelength from about 1250 nm to about 1550 nm. In other embodiments of the present invention, the first layer has a reflectance of more than 40% of all light with a wavelength from about 1250 nm to about 1550 nm. In other embodiments of the present invention, the first layer has a reflectance of more than 50% of all light with a wavelength from about 1250 nm to about 1550 nm. In other embodiments of the present invention, the first layer has a reflectance of more than 60% of all light with a wavelength from about 1250 nm to about 1550 nm. In other embodiments of the present invention, the first layer has a reflectance of more than 70% of all light with a wavelength from about 1250 nm to about 1550 nm. In other embodiments of the present invention, the first layer has a reflectance of more than 80% of all light with a wavelength from about 1250 nm to about 1550 nm. In other embodiments of the present invention, the first layer has a reflectance of from about 25% to about 35% of all light with a wavelength from about 1250 nm to about 1550 nm. In other embodiments of the present invention, the first layer has a reflectance of from about 35% to about 45% of all light with a wavelength from about 1250 nm to about 1550 nm. In other embodiments of the present invention, the first layer has a reflectance of from about 45% to about 55% of all light with a wavelength from about 1250 nm to about 1550 nm. In other embodiments of the present invention, the first layer has a reflectance of from about 55% to about 65% of all light with a wavelength from about 1250 nm to about 1550 nm. In other embodiments of the present invention, the first layer has a reflectance of from about 65% to about 75% of all light with a wavelength from about 1250 nm to about 1550 nm. In other embodiments of the present invention, the first layer has a reflectance of from about 75% to about 85% of all light with a wavelength from about 1250 nm to about 1550 nm. In a preferred embodiment of the present invention, the first layer has a reflectance of more than 60% of all light with a wavelength from about 1250 nm to about 1550 nm In some embodiments of the present invention, the side of the multi-layer backsheet formed by the first layer has a reflectance of more than 50% of all light with a wavelength from about 1250 nm to about 1550 nm. In other embodiments of the present invention, the side of the multi-layer backsheet formed by the first layer has a reflectance of more than 60% of all light with a wavelength from about 1250 nm to about 1550 nm. In other embodiments of the present invention, the side of the multi-layer backsheet formed by the first layer has a reflectance of more than 70% of all light with a wavelength from about 1250 nm to about 1550 nm. In other embodiments of the present invention, the side of the multi-layer backsheet formed by the first layer has a reflectance of more than 80% of all light with a wavelength from about 1250 nm to about 1550 nm. In other embodiments of the present invention, the side of the multi-layer backsheet formed by the first layer has a reflectance of more than 90% of all light with a wavelength from about 1250 nm to about 1550 nm. In other embodiments of the present invention, the side of the multi-layer backsheet formed by the first layer has a reflectance of from about 25% to about 35% of all light with a wavelength from about 1250 nm to about 1550 nm. In other embodiments of the present invention, the side of the multi-layer backsheet formed by the first layer has a reflectance of from about 35% to about 45% of all light with a wavelength from about 1250 nm to about 1550 nm. In other embodiments of the present invention, the side of the multi-layer backsheet formed by the first layer has a reflectance of from about 45% to about 55% of all light with a wavelength from about 1250 nm to about 1550 nm. In other embodiments of the present invention, the side of the multi-layer backsheet formed by the first layer has a reflectance of from about 55% to about 65% of all light with a wavelength from about 1250 nm to about 1550 nm. In other embodiments of the present invention, the side of the multi-layer backsheet formed by the first layer has a reflectance of from about 65% to about 75% of all light with a wavelength from about 1250 nm to about 1550 nm. In other embodiments of the present invention, the side of the multi-layer backsheet formed by the first layer has a reflectance of from about 75% to about 85% of all light with a wavelength from about 1250 nm to about 1550 nm. In other embodiments of the present invention, the side of the multi-layer backsheet formed by the first layer has a reflectance of from about 85% to about 95% of all light with a wavelength from about 1250 nm to about 1550 nm. In a preferred embodiment of the present invention, the side of the multi-layer backsheet formed by the first layer has a reflectance of more than 70% of all light with a wavelength from about 1250 nm to about 1550 nm.

The present invention provides that the second layer has a reflectance of more than 50% of all light with a wavelength from about 380 nm to about 2000 nm. In some embodiments of the present invention, the second layer has a reflectance of more than 40% of all light with a wavelength from about 380 nm to about 2000 nm. In other embodiments of the present invention, the second layer has a reflectance of more than 60% of all light with a wavelength from about 380 nm to about 2000 nm. In other embodiments of the present invention, the second layer has a reflectance of more than 70% of all light with a wavelength from about 380 nm to about 2000 nm. In other embodiments of the present invention, the second layer has a reflectance of from about 25% to about 35% of all light with a wavelength from about 380 nm to about 2000 nm. In other embodiments of the present invention, the second layer has a reflectance of from about 35% to about 45% of all light with a wavelength from about 380 nm to about 2000 nm. In other embodiments of the present invention, the second layer has a reflectance of from about 45% to about 55% of all light with a wavelength from about 380 nm to about 2000 nm. In other embodiments of the present invention, the second layer has a reflectance of from about 55% to about 65% of all light with a wavelength from about 380 nm to about 2000 nm. In other embodiments of the present invention, the second layer has a reflectance of from about 65% to about 75% of all light with a wavelength from about 380 nm to about 2000 nm. In other embodiments of the present invention, the second layer has a reflectance of from about 75% to about 85% of all light with a wavelength from about 380 nm to about 2000 nm. In other embodiments of the present invention, the second layer has a reflectance of from about 85% to about 95% of all light with a wavelength from about 380 nm to about 2000 nm. In a preferred embodiment of the present invention, the second layer has a reflectance of more than 50% of all light with a wavelength from about 380 nm to about 2000 nm.

In some embodiments of the present invention, the second layer has a reflectance of more than 50% of all light with a wavelength from about 380 nm to about 750 nm. In other embodiments of the present invention, the second layer has a reflectance of more than 60% of all light with a wavelength from about 380 nm to about 750 nm. In other embodiments of the present invention, the second layer has a reflectance of more than 70% of all light with a wavelength from about 380 nm to about 750 nm. In other embodiments of the present invention, the second layer has a reflectance of more than 80% of all light with a wavelength from about 380 nm to about 750 nm. In other embodiments of the present invention, the second layer has a reflectance of more than 90% of all light with a wavelength from about 380 nm to about 750 nm. In other embodiments of the present invention, the second layer has a reflectance of from about 50% to about 60% of all light with a wavelength from about 380 nm to about 750 nm. In other embodiments of the present invention, the second layer has a reflectance of from about 60% to about 70% of all light with a wavelength from about 380 nm to about 750 nm. In other embodiments of the present invention, the second layer has a reflectance of from about 70% to about 80% of all light with a wavelength from about 380 nm to about 750 nm. In other embodiments of the present invention, the second layer has a reflectance of from about 80% to about 90% of all light with a wavelength from about 380 nm to about 750 nm. In a preferred embodiment of the present invention, the second layer has a reflectance of more than 80% of all light with a wavelength from about 380 nm to about 750 nm. In a more preferred embodiment of the present invention, the second layer has a reflectance of more than 90% of all light with a wavelength from about 380 nm to about 750 nm.

The reflectance of an object, for example a backsheet in a photovoltaic cell, can be measured, for example, by the ASTM E424 method A using a Varian Cary 5E UV-Vis-NiR Spectrophotometer and integrating sphere. This method is the method used in the present application. It is described in further detail in the Examples below.

Pigments are chemicals that selectively absorb and reflect light of different wavelengths, thereby producing colors. For example, red paint is red because it contains pigments that reflect only the red components of the spectrum (i.e., electromagnetic radiation with a wavelength in the range from about 700 nm to about 635 nm).

In some embodiments of the present invention, the first layer is black. The color black is generated when an object contains pigments that do not reflect any visible light, instead resulting in the light being absorbed or transmitted. Non-limiting examples of such black pigments are carbon black, iron black and titanium black, all of which are commercially available from numerous sources known to those skilled in the art.

In some embodiments of the present invention, the first layer includes infrared-reflective (IR) pigments. Infrared-reflective pigments are pigments that reflect an infrared light, which is electromagnetic radiation in the range from about 770 nm to about 300 μm. Infrared-reflective pigments do not necessarily reflect all infrared light of a given wavelength in said range and do not necessarily reflect all wavelengths within said range equally. For example, an infrared-reflective pigment may only reflect 50% of the infrared light in the range from about 1300 nm to about 1400 nm. By contrast, another infrared-reflective pigment may only reflect 30% of the infrared light in the range from about 1200 nm to about 1300 nm, and 40% of the infrared light in the range from about 1600 nm to about 1700 nm.

In a preferred embodiment of the present invention, the infrared-reflective pigments are inorganic. In a more preferred embodiment of the present invention, the inorganic pigments are mixed metal oxides. Infrared-reflective, inorganic pigments that are mixed metal oxides are sold, for example, under the trademark Arctic® by The Shepherd Color Company, OH, USA. A non-limiting example of such an infrared-reflective pigment that is a mixed metal oxide is the black pigment sold by said company under the product name Black 40P925. This product is derived from chromium green-black hematite.

In some embodiments of the present invention, the second layer is white. The color white is generated when an object contains pigments that reflect all visible light. Non-limiting examples of such white pigments are titanium dioxide, also known as titanium (IV) oxide, titania or $TiO_2$, antimony white, barium sulfate, calcium carbonate and zinc oxide, all of which are commercially available from numerous sources known to those skilled in the art.

In some embodiments of the present invention, the first or second layer or both are gray. There are many tints and shades of the color gray. An object may appear to have the color gray where it is illuminated by sun light, for example, and reflects only a small amount, for example 10%, of all the light within the visible light spectrum. A lighter shade of gray may be present where the object reflects 20% of all the light within the visible light spectrum. An even lighter shade of gray may be present where the object reflects 30% of all the light within the visible light spectrum, and so forth. Different shades of gray can be generated by mixing, for example, pigments that do not reflect any visible light with pigments that reflect all visible light.

To manufacture layers having the light reflectance characteristics of the present invention, specific pigments can be used at specific concentrations. For example, to increase the layers' reflectance of visible light, white pigments, e.g., titanium dioxide, can be used to coat the layers. Alternatively, white pigments can be mixed with the material the layers are made of during the process of manufacturing the layers. To decrease the layers' reflectance of visible light, black pigments, e.g., carbon black, can be used to coat the layers. Alternatively, black pigments can be mixed with the material the layers are made of during the process of manufacturing the layers. To increase the layers' reflectance of infrared light, infrared-reflective pigments, e.g., mixed metal oxides sold under the trademark Arctic® by The Shepherd Color Company (for example Black 40P925), can be used to coat the layers. Alternatively, infrared-reflective pigments can be mixed with the material the layers are made of during the process of manufacturing the layers. The Examples below describe the specific types and amounts of pigments used to manufacture embodiments of backsheets and individual layers within backsheets according to the present invention. The Examples also provide the backsheets' reflectance that results from the use of the specified amounts and types of pigments. Thus, using the Examples as a guide and starting point, those skilled in the art would know that, by changing the amounts of pigments in its layers, one can make backsheets with different reflectance properties.

In some embodiments of the present invention, the infrared-reflective pigments are present at a concentration of from about 1 weight % to about 2 weight % of the total weight of the first layer. In other embodiments of the present invention, the infrared-reflective pigments are present at a concentration of from about 2 weight % to about 3 weight % of the total weight of the first layer. In other embodiments of the present invention, the infrared-reflective pigments are present at a concentration of from about 3 weight % to about 3.8 weight % of the total weight of the first layer. In other embodiments, the infrared-reflective pigments are present at a concentration of from about 3.8 weight % to about 4.2 weight % of the total weight of the first layer. In other embodiments, the infrared-reflective pigments are present at a concentration of from about 4.2 weight % to about 4.7 weight % of the total weight of the first layer. In other embodiments, the infrared-reflective pigments are present at a concentration of from about 4.7 weight % to about 5.3 weight % of the total weight of the first layer. In other embodiments, the infrared-reflective pigments are present at a concentration of from about 5.3 weight % to about 6 weight % of the total weight of the first layer. In other embodiments, the infrared-reflective pigments are present at a concentration of from about 6 weight % to about 6.5 weight % of the total weight of the first layer. In other embodiments, the infrared-reflective pigments are present at a concentration of from about 6.5 weight % to about 7 weight % of the total weight of the first layer. In other embodiments, the infrared-reflective pigments are present at a concentration of from about 7 weight % to about 7.5 weight % of the total weight of the first layer. In other embodiments, the infrared-reflective pigments are present at a concentration of from about 7.5 weight % to about 8 weight % of the total weight of the first layer. In other embodiments, the infrared-reflective pigments are present at a concentration of from about 8 weight % to about 8.5 weight % of the total weight of the first layer. In other embodiments, the infrared-reflective pigments are present at a concentration of from about 8.5 weight % to about 9 weight % of the total weight of the first layer. In other embodiments, the infrared-reflective pigments are present at a concentration of from about 9 weight % to about 10 weight % of the total weight of the first layer. In other embodiments, the infrared-reflective pigments are present at a concentration of from about 10 weight % to about 15 weight % of the total weight of the first layer. In other embodiments, the infrared-reflective pigments are present at a concentration of from about 15 weight % to about 20 weight % of the total weight of the first layer. In other embodiments, the infrared-reflective pigments are present at a concentration of from about 7.25 weight % to about 8.25 weight % of the total weight of the first layer. In other embodiments, the infrared-reflective pigments are present at a concentration of about 6.25 weight % of the total weight of the first layer. In other embodiments, the infrared-reflective pigments are present at a concentration of about 8 weight % of the total weight of the first layer. In other embodiments, the infrared-reflective pigments are present at a concentration of from about 1 weight % to about 9 weight % of the total weight of the first layer. In other embodiments, the infrared-reflective pigments are present at a concentration of from about 4 weight % to about 9 weight % of the total weight of the first layer. In other embodiments, the infrared-reflective pigments are present at a concentration of from about 1 weight % to about 20 weight % of the total weight of the first layer. In a preferred embodiment of the present invention, the infrared-reflective pigments are present at a concentration of from about 1 weight % to about 14 weight % of the total weight of the first layer.

In some embodiments of the present invention, white pigments are present at a concentration of from about 1 weight % to about 5 weight % of the total weight of the second layer. In other embodiments of the present invention, white pigments are present at a concentration of from about 5 weight % to about 10 weight % of the total weight of the second layer. In other embodiments of the present invention, white pigments are present at a concentration of from about 10 weight % to about 13 weight % of the total weight of the second layer. In other embodiments of the present invention, white pigments are present at a concentration of from about 13 weight % to about 17 weight % of the total weight of the second layer. In other embodiments of the present invention, white pigments are present at a concentration of from about 17 weight % to about 20 weight % of the total weight of the second layer. In other embodiments of the present invention, white pigments are present at a concentration of from about 20 weight % to about 30 weight % of the total weight of the second layer. In other embodiments of the present invention, white pigments are present at a concentration of from about 14 weight % to about 16 weight % of the total weight of the second layer.

The concentration of pigments in the layers of the backsheet of the present invention is a function of the relative amount of pigment added to the layers during their manufacture. This means, for example, that a layer of the backsheet that has an amount of pigment that is about 5 weight % of the total weight of the layer is produced by adding 5 g of pigment to 95 g of the polymer mixture (including any additives) from which the layer is produced. The amount of pigments in the layers of the backsheet of the present invention can also be determined by a variety of analytical methods known to those skilled in the art. These methods are therefore not further set forth herein. Such analytical methods are also conducted by commercial testing laboratories, for example CAS-MI Laboratories, MI, USA.

In some embodiments of the present invention, the first layer has a thickness of from about 0.5 µm to about 1 µm. In other embodiments of the present invention, the first layer has a thickness of from about 1 µm to about 3 µm. In other embodiments of the present invention, the first layer has a thickness of from about 3 µm to about 5 µm. In other embodiments of the present invention, the first layer has a thickness of from about 5 µm to about 10 µm. In other embodiments of the present invention, the first layer has a thickness of from about 10 µm to about 25 µm. In other embodiments of the present invention, the first layer has a thickness of from about 25 µm to about 50 µm. In other embodiments of the present invention, the first layer has a thickness of from about 50 µm to about 75 µm. In other embodiments of the present invention, the first layer has a thickness of from about 75 µm to about 100 µm. In other embodiments of the present invention, the first layer has a thickness of from about 100 µm to about 125 µm. In other embodiments of the present invention, the first layer has a thickness of from about 125 µm to about 150 µm. In other embodiments of the present invention, the first layer has a thickness of from about 150 µm to about 250 µm. In other embodiments of the present invention, the first layer has a thickness of from about 250 µm to about 500 µm. In other embodiments of the present invention, the first layer has a thickness of from about 500 µm to about 1 mm. In other embodiments of the present invention, the first layer has a thickness of from about 1 mm to about 10 mm. In other embodiments of the present invention, the first layer has a thickness of from about 10 mm to about 100 mm. In other embodiments of the present invention, the first layer has a thickness of from about 50 µm to about 125 µm. In other embodiments of the present invention, the first layer has a thickness of about 75 µm. In other embodiments of the present invention, the first layer has a thickness of about 100 µm. In a preferred embodiment of the present invention, the first layer has a thickness of from about 20 µm to about 125 µm.

The second layer may have any of the various thicknesses that the first layer may have, as set forth above. In a preferred embodiment of the present invention, the second layer has a thickness of from about 50 µm to about 150 µm.

In some embodiments of the present invention, the multi-layer backsheet has a third layer on that side of the second layer facing away from the first layer. This third layer may have a thickness of from about 2 µm to about 5 µm. In other embodiments of the present invention, the third layer has a thickness of from about 5 µm to about 10 µm. In other embodiments of the present invention, the third layer has a thickness of from about 10 µm to about 20 µm. In other embodiments of the present invention, the third layer has a thickness of from about 20 µm to about 30 µm. In other embodiments of the present invention, the third layer has a thickness of from about 30 µm to about 40 µm. In other embodiments of the present invention, the third layer has a thickness of from about 40 µm to about 60 µm. In other embodiments of the present invention, the third layer has a thickness of from about 60 µm to about 80 µm. In other embodiments of the present invention, the third layer has a thickness of from about 80 µm to about 150 µm. In other embodiments of the present invention, the third layer has a thickness of from about 150 µm to about 300 µm. In other embodiments of the present invention, the third layer has a thickness of from about 300 µm to about 500 µm. In other embodiments of the present invention, the third layer has a thickness of from about 500 µm to about 700 µm. In other embodiments of the present invention, the third layer has a thickness of from about 700 µm to about 1 mm. In other embodiments of the present invention, the third layer has a thickness of from about 1 mm to about 1.5 mm. In other embodiments of the present invention, the third layer has a thickness of from about 1.5 mm to about 2 mm. In other embodiments of the present invention, the third layer has a thickness of from about 2 mm to about 2.5 mm. In other embodiments of the present invention, the third layer has a thickness of from about 2.5 mm to about 5 mm. In other embodiments of the present invention, the third layer has a thickness of from about 5 mm to about 7.5 mm. In other embodiments of the present invention, the third layer has a thickness of from about 7.5 mm to about 10 mm. In other embodiments of the present invention, the third layer has a thickness of from about 10 mm to about 100 mm. In other embodiments of the present invention, the third layer has a thickness of from about 15 µm to about 1.5 mm. In preferred embodiments of the present invention, the third layer has a thickness of about 25 µm.

In some embodiments of the present invention, a layer consisting essentially of a polyester is disposed between the second and the third layer. This layer provides the dielectric resistance to the multi-layer backsheet. A non-limiting example of the polyester that can be used is polyethylene terephthalate (PET). This polyester layer of the present invention may have a variety of thicknesses. In some embodiments of the present invention, the polyester layer has a thickness of from about 20 µm to about 50 µm. In other embodiments of the present invention, the polyester layer has a thickness of from about 50 µm to about 80 µm. In other embodiments of the present invention, the polyester layer has a thickness of from about 80 µm to about 100 µm. In other embodiments of the present invention, the polyester layer has a thickness of from about 100 µm to about 120 µm. In other embodiments of the present invention, the polyester layer has a thickness of from about 120 µm to about 130 µm. In other embodiments of the present invention, the polyester layer has a thickness of from about 130 µm to about 150 µm. In other embodiments of the present invention, the polyester layer has a thickness of from about 150 µm to about 180 µm. In other embodiments of the present invention, the polyester layer has a thickness of from about 180 µm to about 200 µm. In other embodiments of the present invention, the polyester layer has a thickness of from about 200 µm to about 300 µm. In other embodiments of the present invention, the polyester layer has a thickness of from about 300 µm to about 500 µm. In preferred embodiments of the present invention, the polyester layer has a thickness of about 125 µm.

The first, the second and the third layer of the multi-layer backsheet of the present invention can be made of any weatherable material that protects the photovoltaic cells and other module components from moisture, UV exposure, extreme temperatures, etc. Non-limiting examples of such weatherable materials are fluoropolymers, including but not limited to polyvinyl fluoride (PVF), polyvinylidene fluoride (PVDF), ethylene-terafluoethylene (ETFE), fluorinated ethylene-propylene (FEP), perfluoroalkoxy (PFA), ethylene chlorotrifluoroethylene (ECTFE) and polychlorotrifluoroethane (PCTFE; commercially available from Honeywell for example). Other weatherable materials may be used in addition to or instead of a fluoropolymer, including silicone polyesters, chlorine-containing materials such as polyvinyl chloride (PVC), plastisols, ethylene vinyl acetate (EVA), linear low-density polyethylene (LLDPE), acrylics and polyimides (commercially available from DuPont for example). The first, the second and the third layer of the multi-layer backsheet may be made of different materials. See, e.g., U.S. Pat. Nos. 7,829,783; 8,062,744 and 7,985,919. In preferred embodiments of the present invention, the first layer comprises linear low-density polyethylene (LLDPE) and ethylene vinyl acetate (EVA). In preferred embodiments of the present invention, the second layer comprises linear low-density polyethylene (LLDPE) and ethylene vinyl acetate (EVA). In more preferred embodiments of the present invention, the first and the second layer consist essentially of a mixture of linear low-density polyethylene (LLDPE) and 1-5% by weight of ethylene vinyl acetate (EVA). In other embodiments of the present invention, the third layer consists essentially of ethylene chlorotrifluoroethylene (ECTFE).

In some embodiments of the present invention, the first layer includes a plurality of sub-layers. In other embodiments of the present invention, the first layer includes three sub-layers, wherein the first sub-layer consists essentially of a mixture of LLDPE and 1-5% by weight of EVA, wherein the second sub-layer consists essentially of LLDPE, and wherein the third dub-layer consists essentially of a mixture of LLDPE and 1-5% by weight of EVA. In these embodiments, the sub-layer consisting essentially of LLDPE is disposed between the two sub-layers consisting essentially of a mixture of LLDPE and 1-5% by weight of EVA.

In some embodiments of the present invention, the sub-layers have the same concentration of infrared-reflective pigments. In other embodiments of the present invention, the plurality of sub-layers have different concentrations of infrared-reflective pigments. In other embodiments of the present invention, the sub-layers each contain infrared-reflective pigments at a concentration of about 4 weight % of the total weight of the sub-layer containing the pigment. In other embodiments of the present invention, the sub-layers each contain infrared-reflective pigments at a concentration of about 5 weight % of the total weight of the sub-layer containing the pigment. In other embodiments of the present invention, the sub-layers each contain infrared-reflective pigments at a concentration of about 6 weight % of the total weight of the sub-layer containing the pigment. In other embodiments of the present invention, the sub-layers each contain infrared-reflective pigments at a concentration of about 7 weight % of the total weight of the sub-layer containing the pigment. In other embodiments of the present invention, the sub-layers each contain infrared-reflective pigments at a concentration of about 8 weight % of the total weight of the sub-layer containing the pigment. In other embodiments of the present invention, the sub-layers each contain infrared-reflective pigments at a concentration of about 9 weight % of the total weight of the sub-layer containing the pigment. In other embodiments of the present invention, the sub-layers each contain infrared-reflective pigments at a concentration of about 10 weight % of the total weight of the sub-layer containing the pigment. In other embodiments of the present invention, one of the sub-layers contains infrared-reflective pigments at a concentration of about 4 weight % of the total weight of the sub-layer containing the pigment. In other embodiments of the present invention, one of the sub-layers contains infrared-reflective pigments at a concentration of about 5 weight % of the total weight of the sub-layer containing the pigment. In other embodiments of the present invention, one of the sub-layers contains infrared-reflective pigments at a concentration of about 6 weight % of the total weight of the sub-layer containing the pigment. In other embodiments of the present invention, one of the sub-layers contains infrared-reflective pigments at a concentration of about 7 weight % of the total weight of the sub-layer containing the pigment. In other embodiments of the present invention, one of the sub-layers contains infrared-reflective pigments at a concentration of about 8 weight % of the total weight of the sub-layer containing the pigment. In other embodiments of the present invention, one of the sub-layers contains infrared-reflective pigments at a concentration of about 9 weight % of the total weight of the sub-layer containing the pigment. In other embodiments of the present invention, one of the sub-layers contains infrared-reflective pigments at a concentration of about 10 weight % of the total weight of the sub-layer containing the pigment.

In some embodiments of the present invention, the sub-layers have the same thickness. In other embodiments of the present invention, the sub-layers have different thicknesses. In other embodiments of the present invention, the sub-layers each have a thickness of from about 0.8 mil (about 20 µm) to about 2.2 mil (about 56 µm). In other embodiments of the present invention, the sub-layers consisting essentially of a mixture of LLDPE and 1-5% by weight of EVA have a thickness of about 1 mil (about 25 µm) and the sub-layers consisting essentially of LLDPE have a thickness of about 2 mil (about 50 µm). In other embodiments of the present invention, the sub-layers consisting essentially of a mixture of LLDPE and 1-5% by weight of EVA have a thickness of from about 15 µm to about 60 µm and the sub-layers consisting essentially of LLDPE have a thickness of from about 30 µm to about 70 µm.

The multi-layer backsheet of the present invention can have a variety of thicknesses. In some embodiments of the present invention, the multi-layer backsheet has a thickness of from about 1 µm to about 10 µm. In other embodiments of the present invention, the multi-layer backsheet has a thickness of from about 10 µm to about 30 µm. In other embodiments of the present invention, the multi-layer backsheet has a thickness of from about 30 µm to about 50 µm. In other embodiments of the present invention, the multi-layer backsheet has a thickness of from about 50 µm to about 80 µm. In other embodiments of the present invention, the multi-layer backsheet has a thickness of from about 80 µm to about 100 µm. In other embodiments of the present invention, the multi-layer backsheet has a thickness of from about 100 µm to about 150 µm. In other embodiments of the present invention, the multi-layer backsheet has a thickness of from about 150 µm to about 200 µm. In other embodiments of the present invention, the multi-layer backsheet has a thickness of from about 200 µm to about 250 µm. In other embodiments of the present invention, the multi-layer backsheet has a thickness of from about 250 µm to about 300 µm. In other embodiments of the present invention, the multi-layer backsheet has a thickness of from about 300 µm to about 350 µm. In other embodiments of the present invention, the multi-layer backsheet has a thickness of from about 350 µm to about 400 µm. In other embodiments of the present invention, the multi-layer backsheet has a thickness of from about 400 µm to about 500 µm. In other embodiments of the present invention, the multi-layer backsheet has a thickness of from about 500 µm to about 750 µm. In other embodiments of the present invention, the multi-layer backsheet has a thickness of from about 750 µm to about 1 mm. In other embodiments of the present invention, the multi-layer backsheet has a thickness of from about 1 mm to about 2.5 mm. In other embodiments of the present invention, the multi-layer backsheet has a thickness of from about 2.5 mm to about 5 mm. In other embodiments of the present invention, the multi-layer backsheet has a thickness of from about 5 mm to about 10 mm. In other embodiments of the present invention, the multi-layer backsheet has a thickness of from about 10 mm to about 50 mm. In other embodiments of the present invention, the multi-layer backsheet has a thickness of from about 50 mm to about 100 mm. In other embodiments of the present invention, the multi-layer backsheet has a thickness of from about 100 mm to about 200 mm. In other embodiments of the present invention, the multi-layer backsheet has a thickness of from about 100 µm to about 1.7 mm.

The thickness of the backsheet and the layers of the present invention can be determined by any of the numerous means generally known in the art.

The layers of the present invention can be manufactured by mixing the desired polymers, co-polymers, as well as mixtures of (co-)polymers, and any additives, with the desired amounts of the pigments disclosed herein. These mixtures are then processed by one of the various extrusion methods or other methods generally known in the plastic manufacturing and processing art. The individual layers and sub-layers of the multi-layer backsheet can be adhered together by any of the numerous means generally known in the art. Non-limiting examples of such methods are co-extrusion and lamination. See, e.g., U.S. Pat. Nos. 7,829,783; 8,062,744 and 7,985,919; see also U.S. Patent Publication No. 2011/0043901.

The present invention provides that the first layer and the second layer are adjacent to each other. In some embodiments of the present invention, the first layer and the second layer contact each other and there is no additional material disposed between them. In other embodiments of the present invention, there is a transparent layer between the first layer and the second layer.

The present invention provides for a photovoltaic module comprising a transparent top layer, a multi-layer backsheet and at least one encapsulant-embedded photovoltaic cell disposed between the transparent top layer and the multi-layer backsheet. The transparent top layer of the present invention may be made of any suitable material known to those skilled in the art. It may consist of plastic or glass. Non-limiting examples of suitable plastic include polychlorotrifluoroethlyene (PCTFE), ethylene chlorotrifluoroethlyene (ECTFE), ethylene tetrafluoroethylene (ETFE), fluorinated ethylene propylene (FEP), polytetrafluoroethylene (PTFE), and/or other low-haze, optically clear, moisture permeation resistant barrier plastic films, preferably with long-term opacity in the ultraviolet (UV) spectrum, light-trapping surface geometry, and of a thickness from about 20 µm to 500 µm.

The term encapsulant as used herein refers to any material that is known to those skilled in the art as suitable for embedding photovoltaic cells in photovoltaic modules. Non-limiting examples of such material include highly transparent, electrically insulating resin such as ethylene vinyl acetate (EVA) or polyvinyl butyral (PVB), or moisture permeation resistant epoxy resin such as bisphenol-A cured with polyamide, polyamide, amidoamine, or cycloaliphatic amines inclusive of all modified versions of these resins and other common solar module encapsulants. See, e.g., U.S. Pat. Nos. 7,829,783 and 7,985,919.

The present invention also provides multi-layer backsheets for photovoltaic modules that comprise a layer comprising infrared-reflective (IR) pigments and an adjacent backing layer. In some embodiments of the present invention, this backing layer is white. The multi-layer backsheets of the present invention reflect more infrared light than similar backsheets without an adjacent white backing layer. In addition, photovoltaic modules containing said multi-layer backsheets of the present invention have a lower operating temperature than photovoltaic modules containing said similar backsheets without an adjacent white backing layer. The photovoltaic modules of the present invention may comprise any of the embodiments of the multi-layer backsheets of the present invention disclosed herein.

The manufacture of photovoltaic cells, photovoltaic modules and backsheets in general is well known to those skilled in the art. See, e.g., Augustin McEvoy et al., Practical Handbook of Photovoltaics—Fundamentals and Applications, Academic Press, $1^{st}$ Edition, 2011; and G.N. Tiwari and Swapnil Dubey, Fundamentals of Photovoltaic Modules and their Applications, RSC Publishing, 2010.

The following examples further illustrate the invention, but should not be construed to limit the scope of the invention in any way.

EXAMPLES

Example 1

Making Photovoltaic Modules and Backsheets

Full size (approx. 1 meter×1.6 meter) photovoltaic modules were built using identical components (e.g., photovoltaic cells, transparent top layer made out of glass, EVA encapsulant, frame, etc.). The only difference between the modules was the backsheet used. The following modules were built: (i) modules with the traditional black backsheets that did not contain any infrared-reflective (IR) pigments (negative control), (ii) modules with black backsheets that contained infrared-reflective (IR) pigments, (iii) modules with black backsheets that contained infrared-reflective (IR) pigments and a white backing layer, and (iv) modules with a white backsheet (positive control). In total, eight modules were built, two of each kind.

Black backsheets that contained infrared-reflective (IR) pigments were made as follows. An about 25 µm thick white layer of ethylene chlorotrifluoroethylene (ECTFE) resin containing the pigment $TiO_2$ was laminated to an about 125 µm thick layer of polyethylene terephthalate (PET) using a polyurethane adhesive (which was about 10 µm thick). The side of this bi-layer structure formed by the PET layer was then laminated, using the same adhesive, to an about 100 µm thick layer consisting essentially of a mixture of LLDPE and 1-5% by weight of EVA comprising about 6.25 weight % (of the total weight of this layer) of the infrared-reflective (IR) black pigment sold by The Shepherd Color Company under the product name Black 40P925. Black backsheets that contained infrared-reflective (IR) pigments and a white backing layer were made as follows. The above bi-layer structure was laminated to an about 150 µm thick layer consisting essentially of a mixture of LLDPE and 1-5% by weight of EVA, using the same adhesive. This 150 µm thick layer was composed of a first and a second layer (i.e., the backing layer), which had been made simultaneously by blown co-extrusion, thus not using any adhesive. The first layer, facing away from the ECTFE/PET bi-layer structure, was about 40 µm thick and comprised about 8 weight % (of the total weight of this first layer) of the infrared-reflective (IR) black pigment sold by The Shepherd Color Company under the product name Black 40P925. The second layer, facing towards the ECTFE/PET bi-layer structure, was about 110 μm thick and comprised about 15 weight % (of the total weight of this second layer) of the white pigment $TiO_2$. Traditional black backsheets that did not contain any infrared-reflective (IR) pigments (negative control) and white backsheets (positive control) were made as the black backsheets that contained infrared-reflective (IR) pigments but no white backing layer, except that the pigments carbon black (1%) and $TiO_2$ (15%) were used, respectively. All pigments used were added to and mixed with the polymers before the polymers were extruded into layers.

Example 2

Testing Photovoltaic Modules and Backsheets

Figure 2:
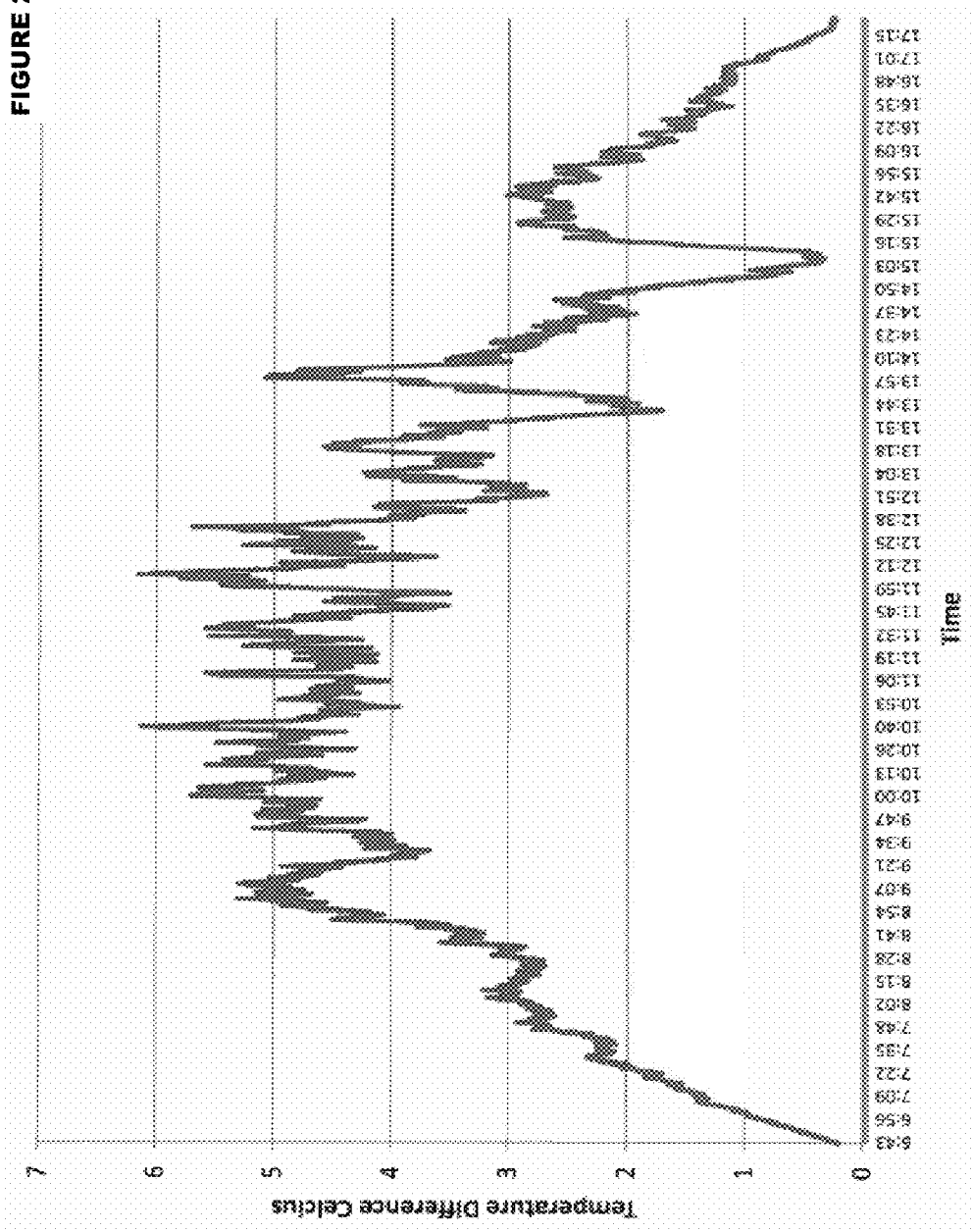
FIG. 2 shows the difference between the temperature (in Celsius) of a photovoltaic module with a backsheet containing infrared-reflective (IR) pigments and the temperature of a photovoltaic module with a backsheet containing no infrared-reflective (IR) pigments. The temperature difference is plotted over the time of the day the temperature measurements were taken.

The modules were mounted outdoors on a rack and were exposed to the elements. The modules' temperatures were measured at various points throughout the day. The ambient temperature was also recorded throughout the testing period. Thermocouples were connected to the surface of the glass top layer of the modules and also embedded into the center of each module, right behind the photovoltaic cells. The temperature measurements (see FIG. 1) indicated that photovoltaic modules with a backsheet containing infrared-reflective (IR) pigments had a lower operating temperature than photovoltaic modules with a backsheet containing no infrared-reflective (IR) pigments. This temperature difference was also measured over time (see FIG. 2). Measurements of the voltage generated by the tested photovoltaic modules in response to sun light revealed that photovoltaic modules with a backsheet containing infrared-reflective (IR) pigments generated a higher voltage than photovoltaic modules with a backsheet containing no infrared-reflective (IR) pigments (see FIG. 3).

Measurements of the reflectance of (1) traditional black backsheets containing no infrared-reflective (IR) pigments (negative control), (2) of black backsheets containing infrared-reflective (IR) pigments, (3) of black backsheets containing infrared-reflective (IR) pigments and a white backing layer, and (4) of white backsheets (positive control) revealed that black backsheets containing infrared-reflective (IR) pigments and a white backing layer reflect more infrared light than black backsheets containing infrared-reflective (IR) pigments but no white backing layer (see FIG. 4). Reflectance was determined in percent of incoming light by the ASTM E424 method A, using a Varian Cary 5E UV-Vis-NiR Spectrophotometer and integrating sphere as further described below. Using the 110 mm diameter integrating sphere, a baseline measurement was obtained using a $BaSO_4$ white tile. Once the baseline was established, 4 inch×4 inch backsheet samples were mounted flat against the integrating sphere port, making sure that the samples covered the entire port area so that no light could escape. Backsheet samples were mounted such that the side usually facing the photovoltaic cell faced the incident light beam. Reflectance measurements were then obtained on each sample over the spectral range from 250 to 2500 nm.

What is claimed is:

1. A multi-layer backsheet for a photovoltaic module comprising: a first layer having a reflectance of more than 25% of a light with a wavelength anywhere from about 1000 nm to about 2100 nm, and a reflectance of less than 10% of all light with a wavelength from about 380 nm to about 750 nm; and a second layer having a reflectance of more than 50% of all light with a wavelength from about 380 nm to about 2000 nm; wherein said first layer and said second layer are adjacent to each other.

2. The multi-layer backsheet of claim 1, wherein the first layer comprises infrared-reflective pigments.

3. The multi-layer backsheet of claim 2, wherein the infrared-reflective pigments are inorganic pigments.

4. The multi-layer backsheet of claim 3, wherein the second layer has a reflectance of more than 80% of all light with a wavelength from about 380 nm to about 750 nm.

5. The multi-layer backsheet of claim 4, wherein the inorganic pigments are mixed metal oxides.

6. The multi-layer backsheet of claim 2, wherein the infrared-reflective pigments are present at a concentration of from about 1 weight % to about 20 weight % of the total weight of the first layer.

7. The multi-layer backsheet of claim 6, wherein the first layer has a thickness of from about 20 μm to about 125 μm, and the second layer has a thickness of from about 50 μm to about 150 μm.

8. The multi-layer backsheet of claim 2, wherein the first layer and the second layer each comprise a polymer.

9. The multi-layer backsheet of claim 8, wherein the first layer has a reflectance of more than 50% of a light with a wavelength anywhere from about 1250 nm to about 1550 nm; wherein the second layer has a reflectance of more than 90% of all light with a wavelength from about 380 nm to about 750 nm; wherein the infrared-reflective pigments are present at a concentration of from about 1 weight % to about 14 weight % of the total weight of the first layer; and wherein the first layer has a thickness of from about 20 μm to about 125 μm, and the second layer has a thickness of from about 50 μm to about 150 μm.

10. The multi-layer backsheet of claim 9, wherein the first layer has a reflectance of more than 60% of all light with a wavelength from about 1250 nm to about 1550 nm; and wherein the first layer and the second layer each comprise ethylene vinyl acetate.

11. The multi-layer backsheet of claim 1, wherein the side of the multi-layer backsheet formed by the first layer has a reflectance of more than 70% of all light with a wavelength from about 1250 nm to about 1550 nm.

12. A photovoltaic module comprising the multi-layer backsheet of claim 1.

13. The photovoltaic module of claim 12, further comprising a transparent top layer.

14. The photovoltaic module of claim 13, further comprising an encapsulant-embedded photovoltaic cell disposed between the transparent top layer and the multi-layer backsheet.

15. The photovoltaic module of claim 14, wherein the encapsulant comprises ethylene vinyl acetate.

16. A photovoltaic module comprising the multi-layer backsheet as defined in claim 10, further comprising a transparent top layer and an encapsulant-embedded photovoltaic cell disposed between the transparent top layer and the multi-layer backsheet.

17. A method of converting sunlight into electricity, comprising a step of exposing the photovoltaic module of claim 14 to sun light.

18. The multi-layer backsheet of claim 5, wherein the mixed metal oxides are derived from chromium green-black hematite.

19. The multi-layer backsheet of claim 1, wherein the first layer comprises linear low-density polyethylene and ethylene vinyl acetate, and wherein the first layer comprises a first sub-layer, a second sub-layer, and a third sub-layer each comprising polymeric materials, wherein the second sub-layer is disposed between the first and third sub-layers, and wherein the polymeric materials of the first sub-layer consist essentially of linear low-density polyethylene and ethylene vinyl acetate, the polymeric materials of the second sub-layer consist essentially of linear low-density polyethylene, and the polymeric materials of the third sub-layer consist essentially of linear low-density polyethylene and ethylene vinyl acetate.

* * * * *